(12) United States Patent
Zhang et al.

(10) Patent No.: US 10,760,752 B2
(45) Date of Patent: Sep. 1, 2020

(54) ILLUMINATING DEVICE HAVING A PLURALITY OF ASYMMETRICAL LENSES MOUNTED TO A HOLDER WITH CORRESPONDING ASYMMETRICAL OPENINGS

(71) Applicant: SEOUL SEMICONDUCTOR CO., LTD., Ansan-si (KR)

(72) Inventors: Ming Jun Zhang, Ansan-si (KR); Zhisheng Zhang, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/351,440

(22) Filed: Mar. 12, 2019

(65) Prior Publication Data

US 2019/0368673 A1     Dec. 5, 2019

(30) Foreign Application Priority Data

May 30, 2018  (CN) .......................... 2018 1 0538111

(51) Int. Cl.
| | |
|---|---|
| *F21S 8/08* | (2006.01) |
| *F21S 2/00* | (2016.01) |
| *F21V 5/04* | (2006.01) |
| *F21Y 115/10* | (2016.01) |
| *F21V 17/12* | (2006.01) |

(52) U.S. Cl.
CPC ............... *F21S 8/085* (2013.01); *F21S 2/005* (2013.01); *F21V 5/04* (2013.01); *F21V 17/12* (2013.01); *F21Y 2115/10* (2016.08)

(58) Field of Classification Search
CPC .......... F21V 5/08; F21V 5/007; F21V 17/164; F21V 5/004; F21Y 2115/10; F21Y 2105/10
See application file for complete search history.

(56) References Cited

U.S. PATENT DOCUMENTS

| | | | |
|---|---|---|---|
| 4,941,072 A | 7/1990 | Yasumoto et al. | |
| 7,637,630 B2* | 12/2009 | Wilcox ................... | F21V 5/04 362/158 |
| 8,348,462 B2* | 1/2013 | Vasta ....................... | F21S 8/08 362/239 |
| 2009/0310356 A1 | 12/2009 | Laporte | |

(Continued)

FOREIGN PATENT DOCUMENTS

DE     20 2013 010052         2/2015

OTHER PUBLICATIONS

Extended European Search Report dated Aug. 30, 2019, issued in European Patent Application No. 19159803.6.

*Primary Examiner* — Robert J May
(74) *Attorney, Agent, or Firm* — H.C. Park & Associates, PLC

(57) ABSTRACT

A light emitting device module including a substrate including a plurality of light emitting areas, light emitting devices disposed in each light emitting area and to emit light, windows disposed on the substrate, each of the windows covering one of the light emitting areas and having an asymmetrical shape with respect to one direction, and a holder for coupling the windows, the holder including a plurality of openings each having an asymmetrical shape, in which each of the windows is individually disposed in a corresponding one of the openings and is detachably coupled to the holder.

18 Claims, 8 Drawing Sheets

(56) References Cited

U.S. PATENT DOCUMENTS

2011/0019425 A1* 1/2011 Chen .................... F21V 5/08
            362/311.02
2011/0085329 A1  4/2011 Kuo

* cited by examiner

ILLUMINATING DEVICE HAVING A PLURALITY OF ASYMMETRICAL LENSES MOUNTED TO A HOLDER WITH CORRESPONDING ASYMMETRICAL OPENINGS

CROSS-REFERENCE TO RELATED APPLICATION

This application claims priority from and the benefit of Chinese Patent Application No. 201810538111.6, filed on May 30, 2018, which is hereby incorporated by reference for all purposes as if fully set forth herein.

BACKGROUND

Field

Exemplary embodiments of the invention relate generally to a light emitting device module and, more specifically, to a light emitting device module used as an exterior lighting.

Discussion of the Background

A light emitting diode is a semiconductor light emitting device that emits light from an electric potential difference when electrons and holes are recombined in a P-N semiconductor junction structure by a current applied thereto. A light emitting device employing a light emitting diode has advantages, such as eco-friendly property, lower voltage operation, longer lift-span, and lower price than a conventional light source.

A light emitting diode has been widely applied to simple information displays, such as display lamps and a number display, however, the light emitting diode is recently being used in a variety of fields, such as in a display field, in a lighting field, car head lamp, or projector, with the development of industrial technology, especially with the development of information display technology and semiconductor technology. In particular, the light emitting diode is being applied to external fixtures, such as a street light and a traffic light. Accordingly, when the light emitting diode is used in the external fixtures that are exposed to relatively harsh environments, the light emitting diode may require more durable structure.

The above information disclosed in this Background section is only for understanding of the background of the inventive concepts, and, therefore, it may contain information that does not constitute prior art.

SUMMARY

A light emitting device module constructed according to exemplary embodiments of the invention is capable of being easily attachable and detachable.

Additional features of the inventive concepts will be set forth in the description which follows, and in part will be apparent from the description, or may be learned by practice of the inventive concepts.

A light emitting device module according to an exemplary embodiment includes a substrate including a plurality of light emitting areas, light emitting devices disposed in each light emitting area and to emit light, windows disposed on the substrate, each of the windows covering one of the light emitting areas and having an asymmetrical shape with respect to one direction, and a holder for coupling the windows, the holder including a plurality of openings each having an asymmetrical shape, in which each of the windows is individually disposed in a corresponding one of the openings and is detachably coupled to the holder.

Each of the windows and the holder may include an insertion member to guide a coupling direction between the window and the holder, and the insertion member may have an asymmetrical shape with respect to one direction.

Each window may further include an insertion protrusion protruded toward the holder, and the holder may further include an insertion recess into which the insertion protrusion is inserted.

The insertion protrusion may include a first insertion protrusion and a second insertion protrusion having different lengths from each other and disposed at opposite sides of the window.

Light emitted from the light emitting device may have an anisotropy, and the first and second insertion protrusions may protrude in directions corresponding to the anisotropy of light.

The protruding directions of the first and second insertion protrusions may be the same as each other.

The holder may include holder coupling protrusions protruding toward each window, each window may include a window coupling protrusion protruding toward the holder, and the holder coupling protrusion and the window coupling protrusion may be engaged with each other.

The holder may further include a slot recessed from a surface of the holder and disposed adjacent to the holder coupling protrusion.

The slot may have a width that gradually decreases from the surface of the holder.

Each window may further include a supporting protrusion protruding toward the holder, and the holder may include a supporting recess corresponding to the supporting protrusion to stop the movement of the window in a predetermined direction beyond a predetermined distance.

Each window may include a lens part disposed to correspond to the light emitting area and having a curved surface, and a flat part may be disposed around the lens part and be substantially parallel to a surface of the substrate.

The lens parts of the windows may have the same shape as each other.

The lens parts of the windows may have different shapes from each other.

Each window may be configured to change a direction of light emitted from the light emitting.

A ratio of a width to a length of the holder may be about 1:0.8 to about 1:1.25, and a ratio of a width to a length of the window may be about 1:0.5 to about 1:1.3.

A window unit for a light emitting device module according to an exemplary embodiment includes one or more windows respectively covering light emitting areas and having an asymmetrical shape with respect to one direction, and a holder for coupling the windows, the holder including a plurality of openings each having an asymmetrical shape, in which each of the windows is individually provided in a corresponding one of the openings and is detachably coupled to the holder.

A light emitting device module according to an exemplary embodiment includes a substrate including a plurality of light emitting areas, light emitting devices disposed in each light emitting area to emit light in an upward direction, windows disposed on the substrate to cover each light emitting area, and a holder to couple the windows, the holder including openings that correspond to each of the light emitting areas, in which each of the windows is detachably coupled to the holder and individually provided in a corresponding opening among the openings along a direction to anisotropically control an advance direction of light.

A street light according to an exemplary embodiment includes a pole extending in one direction, an arm connected to one side portion of the pole, and a light emitting device module disposed at one end portion of the arm, the light emitting device module including a substrate including a plurality of light emitting areas, light emitting devices disposed in each light emitting area to emit light, windows disposed on the substrate, each of the windows covering each light emitting area and having an asymmetrical shape with respect to one direction, and a holder to couple the windows, the holder including a plurality of openings each having an asymmetrical shape, in which each of the windows is individually disposed in a corresponding one of the openings and is detachably coupled to the holder.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
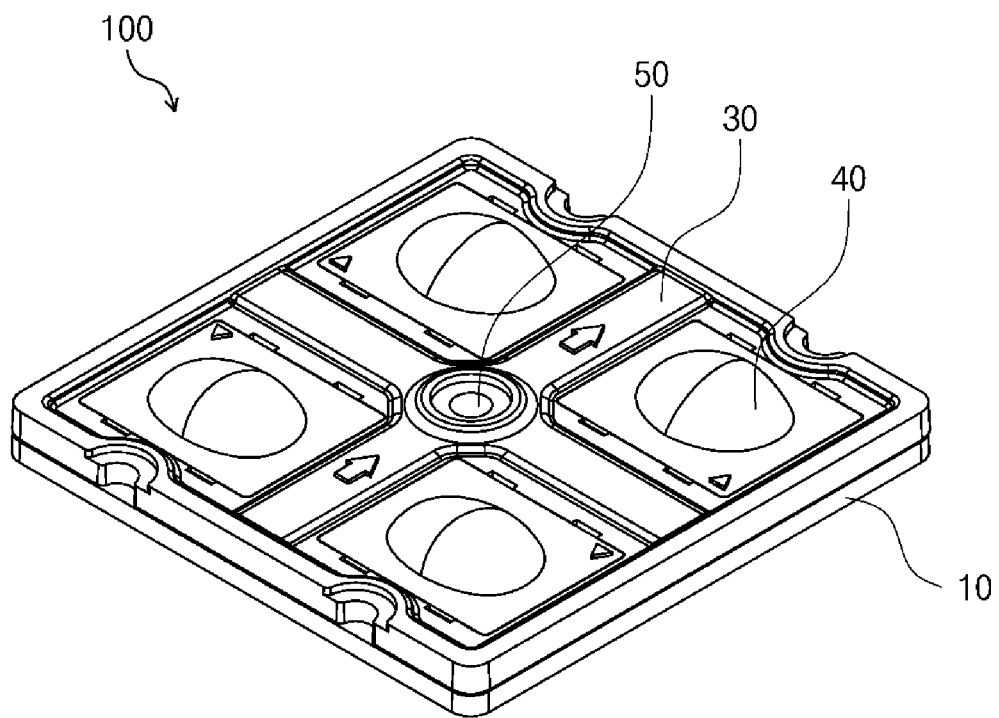
FIG. 1 is a perspective view of a light emitting device module according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
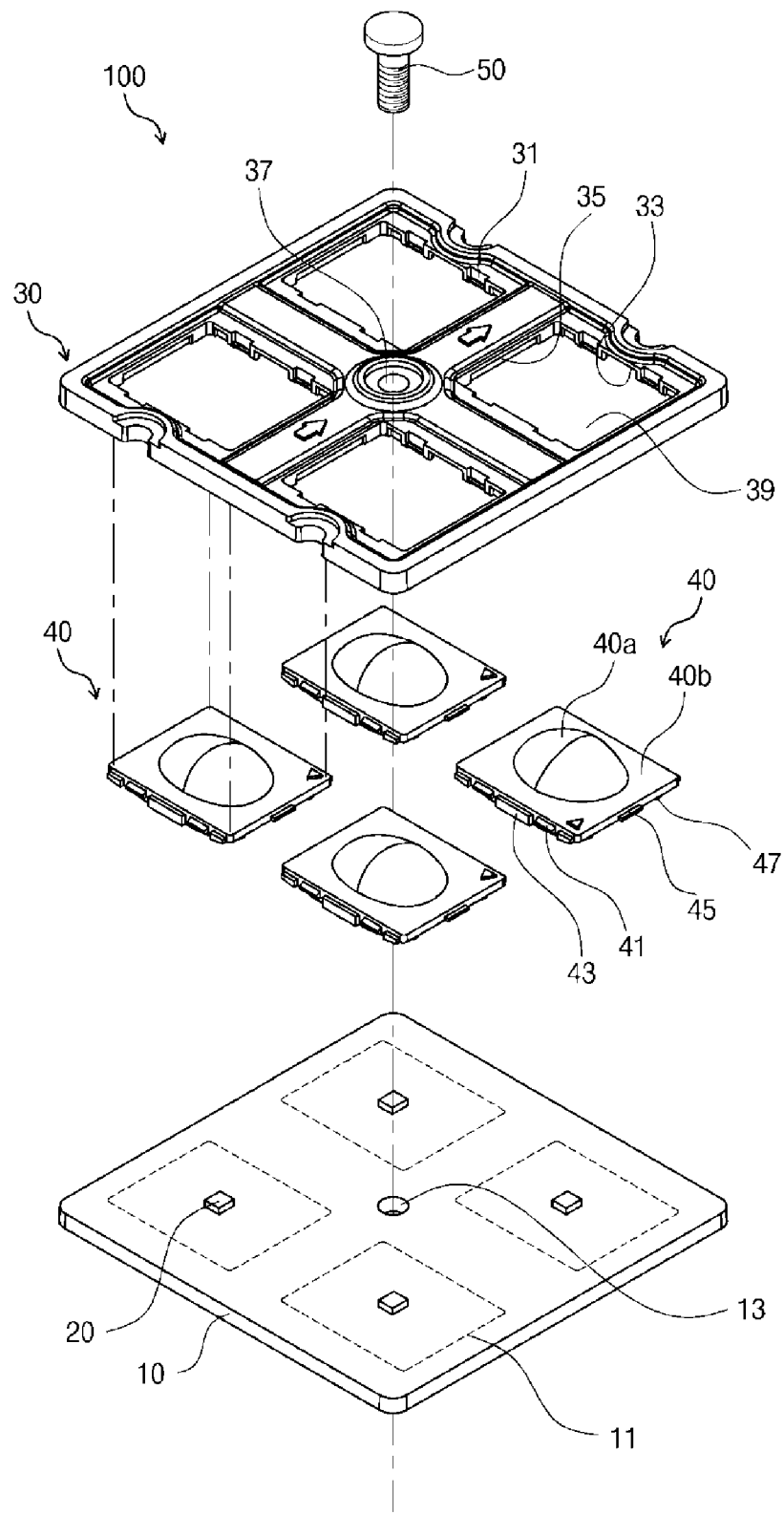
FIG. 2 is an exploded perspective view of the light emitting device module of FIG. 1.

FIG. 1 is a perspective view of a light emitting device module according to an exemplary embodiment, and FIG. 2 is an exploded perspective view of the light emitting device module of FIG. 1.

Referring to FIGS. 1 and 2, the light emitting device module 100 according to an exemplary embodiment includes a substrate 10, a light emitting device 20 disposed on the substrate 10, and a window unit covering the substrate 10 and the light emitting device 20.

The substrate 10 is provided for mounting one or more light emitting devices 20 thereon. The substrate 10 includes one or more light emitting areas 11 defined therein, in which the light emitting device 20 is disposed to emit light. In an exemplary embodiment, one or more light emitting devices 20 may be disposed in every light emitting area 11.

In an exemplary embodiment, a plurality of light emitting areas 11 may be defined on the substrate 10, and a size and an amount of light of the light emitting device module 100 may be determined by the number of the light emitting areas 11. For example, the light emitting areas 11 may be arranged in a two-by-two (2×2) matrix form. However, the inventive concepts are not limited thereto. As another example, the light emitting areas 11 may be arranged in various ways, e.g., three-by-four (3×4) or two-by-six (2×6) matrix form.

The substrate 10 may have a variety of shapes. For example, the substrate 10 may have a substantially quadrangular shape when viewed in a plan view, and may be provided in a plate shape with a predetermined height, however, the shape of the substrate 10 is not be limited thereto. In some exemplary embodiments, the substrate 10 may have a substantially oval or circular shape.

The substrate 10 includes a wiring and a terminal to supply power to the light emitting device 20. In an exemplary embodiment, the substrate 10 may be a printed circuit board. However, the inventive concepts are not limited thereto, and the substrate 10 may include various materials and have various shapes.

For example, at least a portion of the substrate 10 may include a material having high thermal conductivity. The substrate 10 may include metal, such as copper, iron, nickel, chromium, aluminum, silver, gold, titanium, and alloys thereof. As another example, the substrate 10 may include a non-conductive material, such as ceramic, polymer resin, glass, or composite materials thereof (for example, composite resin or mixture of composite resin and conductive material).

At least one light emitting device 20 is provided for each light emitting area 11 on the substrate 10. For example, one light emitting device 20 may be provided for each light emitting area 11.

In an exemplary embodiment, the light emitting device 20 may emit light in a direction to which an upper surface of the substrate 10 faces. For example, the light emitting device 20 may be disposed on the upper surface of the substrate 10 and may emit light radially. In this case, the light emitting device 20 may emit light uniformly and isotropically at all angles. However, the light emitting direction of the light emitting device 20 should not be limited thereto. For example, the light emitting direction of the light emitting device 20 may be limited to within a certain angle, and in this case, light may be emitted anisotropically along a predetermined direction. As such, when light with a directivity in a specific direction is required, a light emission in the specific direction may be easily implemented by using the light emitting device 20 that emits light anisotropically.

In an exemplary embodiment, the light emitting device 20 may include a light emitting diode chip. The light emitting device 20 may include a light emitting structure and an electrode part, for example.

The light emitting structure may include a first semiconductor layer, an active layer, and a second semiconductor layer, which are sequentially provided.

The first semiconductor layer is a semiconductor layer doped with a first conductive type dopant. The first conductive type dopant may be an n-type dopant. The first conductive type dopant may be Si, Ge, Se, Te, or C. In an exemplary embodiment, the first semiconductor layer may include a nitride-based semiconductor material. For example, the first semiconductor layer may include a semiconductor material represented by the following composition formula of $In_xAl_yGa_{1-x-y}N$ ($0 \leq x \leq 1$, $0 \leq y \leq 1$, $0 \leq x+y \leq 1$). The active layer is disposed on the first semiconductor layer and corresponds to a light emitting layer.

The active layer is a layer in which electrons (or holes) injected through the first conductive type semiconductor layer and holes (or electrons) injected through the second semiconductor layer are combined to emit light by a band gap difference of an energy band according to a material forming the active layer. The active layer may emit at least one peak wavelength of ultraviolet light, blue light, green light, and red light, for example. The active layer may include a compound semiconductor. The active layer may be implemented by, for example, at least one element of compound III-V semiconductors or compound II-VI semiconductors, and may be implemented by a material represented by the following composition formula of $In_xAl_yGa_{1-x-y}N$ ($0 \leq x \leq 1$, $0 \leq y \leq 1$, $0 \leq x+y \leq 1$).

The second semiconductor layer is disposed on the active layer. The second semiconductor layer is a semiconductor layer doped with a second conductive type dopant having a polarity opposite to that of the first conductive type dopant. The second conductive type dopant may be a p-type dopant, and may include Mg, Zn, Ca, Sr, or Ba. In an exemplary embodiment, the second semiconductor layer may include a nitride-based semiconductor material. For example, the second semiconductor layer may include a semiconductor material represented by the following composition formula of $In_xAl_yGa_{1-x-y}N$ ($0 \leq x \leq 1$, $0 \leq y \leq 1$, $0 \leq x+y \leq 1$).

In an exemplary embodiment, a cathode and an anode are respectively disposed on the first semiconductor layer and the second semiconductor layer, and connected to the first semiconductor layer and the second semiconductor layer, and the cathode and the anode are connected to the wiring or the terminal to receive power.

Referring to FIGS. 1 and 2, the window unit may be disposed on the substrate 10 and may cover the light emitting area 11 and a remaining portion of the substrate 10 except for the light emitting area 11. More particularly, the window unit may cover substantially most of the substrate 10 when viewed in a plan view. However, in some exemplary embodiments, the window unit may be partially disposed on a portion of the upper surface of the substrate 10 so that the upper surface of the substrate 10 may be partially exposed.

The window unit includes a window 40 transmitting light from the light emitting device 20 and a holder 30 holding the window 40.

The holder 30 is disposed on the substrate 10 and has a frame shape for holding the window 40. Accordingly, the holder 30 may correspond to the remaining portion of the substrate 10 except for the light emitting area 11. At least one opening 39 is defined in the holder 30 to correspond to a corresponding one of the light emitting areas 11, and the window 40 is disposed in the opening 39.

The opening 39 may have various shapes depending on the shape of the window 40. For example, when the window 40 has a substantially quadrangular shape, the opening 39 may have a substantially quadrangular shape corresponding to the shape of the window 40. As another example, when the window 40 has a substantially oval shape, the opening 39 may have a substantially oval shape corresponding to the shape of the window 40.

The holder 30 may have various shapes depending on a size of the substrate 10 and the number of the light emitting areas 11 defined in the substrate 10. The holder 30 includes components for stably holding and supporting the window 40, and details thereof will be described later.

The window 40 is disposed on each light emitting area 11 in a one-to-one correspondence, and covers a corresponding light emitting area. The window 40 may protect the light emitting device 20 and may function as an optical component for transmitting light emitted from the light emitting device 20 or guiding light emitted from the light emitting device 20 to a predetermined direction.

The window 40 may have various shapes when viewed in a plan view. For example, the window 40 may have a substantially rectangular shape, however, the inventive concepts are not limited to a particular shape of the window 40. For example, in some exemplary embodiments, the window 40 may have a substantially polygonal shape or a substantially oval shape.

In an exemplary embodiment, the shape of the window 40 and the shape of the opening 39 of the holder 30 corresponding to the window 40 may have an asymmetrical shape with respect to a predetermined direction. For example, the window 40 may have a shape where both sides thereof are asymmetric with respect to a line passing through a center of the window 40. In some exemplary embodiments, the shape of the window 40 may be changed in various ways depending on the directivity of light emitted from the light emitting device module 100.

The window 40 may correspond to the shape of the light emitting area 11, and may include a lens part 40a having at least one curved portion and a flat part 40b disposed around the lens part 40a and having an upper surface substantially parallel to the surface of the substrate 10.

The lens part 40a may have a substantially oval shape protruding in an upward direction. The flat part 40b may have a plate shape substantially parallel to the upper surface of the substrate 10 disposed thereunder, and may be disposed around the lens part 40a. However, the inventive concepts are not limited thereto, and the lens part 40a may have other shapes depending on a light emitting efficiency and a light emitting direction.

In addition, the inventive concepts are not limited to the upper surface of the flat part 40b being substantially parallel to the upper surface of the substrate 10. For example, in some exemplary embodiments, a portion of a lower surface of the flat part 40b may be substantially parallel and the other portion of the lower surface of the flat part 40b may be slanted to facilitate coupling with other components. In an exemplary embodiment, the lens part 40a and the flat part 40b may be integrally formed with each other without being separated from each other.

The lens part 40a may have various shapes to change a path of the traveling light in response to a profile of light emitted from the light emitting device 20.

Depending on the application of the light emitting device module 100, a light condensation or dispersion may be required, and thus, the lens part 40a may have various different shapes. For example, the lens part 40a may have a plate shape, a convex lens shape, or a concave lens shape. Further, the lens part 40a may have various shapes, such as a substantially spherical shape, a substantially ovoidal shape, a substantially hemispherical shape, a substantially half-oval spherical shape, or a substantially bifocal shape.

The lens part 40a may include a transparent insulating material to transmit light from the light emitting device 20. The lens part 40a may protect the light emitting device 20 and transmit light emitted from the light emitting device 20.

In addition, the lens part 40a may include a material that may not be deformed or discolored by light emitted from the light emitting device 20. For example, when light emitted from the light emitting device 20 is an ultraviolet light, the lens part 40a may include a material that is not deformed or discolored by the ultraviolet light.

The lens part 40a may include various other materials in some exemplary embodiments. For example, the lens part 40a may include quartz or polymer organic material. When the lens part 40*a* includes the polymer organic material, since a wavelength of light absorbed/transmitted by the polymer organic material is different depending on the type of monomers, a molding method using the monomers, and conditions for forming the polymer by the monomers, the polymer organic material may be selected among various kinds of polymer organic materials by taking into account the wavelength of light emitted from the light emitting device 20. For example, an organic polymer, such as poly (methylmethacrylate) (PMMA), polyvinylalcohol (PVA), polypropylene (PP), and low density polyethylene (PE), hardly absorbs the ultraviolet light, and an organic polymer such as polyester may absorb the ultraviolet light.

In an exemplary embodiment, each window 40 may be detachably coupled to each opening 39 of the holder 30 individually.

The window 40 includes a window coupling protrusion 41 for coupling the window 40 to the holder 30, and the holder 30 includes a holder coupling protrusion 31 corresponding to the window coupling protrusion 41.

The holder 30 may include a supporting recess 33 defined therein to allow the window 40 to be stably coupled to a specific position of the holder 30 without moving too far beyond a predetermined distance when the holder 30 is coupled to the window 40.

In an exemplary embodiment, each of the holder 30 and the window 40 includes a component that can couple the window 40 in a predetermined direction. The window 40 may include an insertion protrusion 45 protruding toward the holder 30 so that the window 40 may be easily coupled to the holder 30 in a light emitting direction. The holder 30 may include an insertion recess 35 into which the insertion protrusion 45 is inserted. The insertion protrusion 45 and the insertion recess 35 are provided to be engaged with each other, and thus, the window 40 may be easily coupled to the holder 30 without misalignment, such as about 90 or 180 degrees of window rotation, or overturning.

In an exemplary embodiment, each of the window coupling protrusion 41, a supporting protrusion 43, and the insertion protrusion 45 may be provided in plural, and the position of each of the window coupling protrusion 41, a supporting protrusion 43, and the insertion protrusion 45 may be variously modified. For example, the window coupling protrusion 41 may be provided in two pairs, and the window coupling protrusions 41 may be disposed at sides facing each other. The supporting protrusions 43 may be disposed between the window coupling protrusions 41 adjacent to each other. In addition, the insertion protrusions 45 may be disposed asymmetrically at two sides, on which the window coupling protrusions 41 are not disposed. However, the number and positions of the window coupling protrusions 41, the supporting protrusions 43, and the insertion protrusions 45 are not particularly limited, and they may be changed in various ways as needed.

The window 40 may include a spacer 47 so as to be spaced apart from the substrate 10 by a predetermined distance when coupled to the substrate 10.

The window unit and the substrate 10 are connected to each other by a main coupling member 50. The main coupling member 50 is used to couple the window unit to the substrate 10, and any component for coupling the window unit and the substrate 10 may be used as the main coupling member 50.

For example, the main coupling member 50 may be a screw. In this case, the holder 30 of the window unit may include a holder hole 37 into which the screw is inserted into, and the substrate 10 may include a substrate hole 13 into which the screw is inserted into. The holder hole 37 and the substrate hole 13 may be located to overlap with each other when viewed in a plan view, and may have substantially the same or different diameters from each other. In addition, a screw thread may or may not be provided on the holder hole 37 and the substrate hole 13. When the screw thread is not provided on the holder hole 37 and the substrate hole 13, an additional component, such as a base plate coupled to the main coupling member 50, may be provided on a lower portion of the substrate 10. In this case, the main coupling member 50 may be screw-coupled to the base plate after passing through the holder hole 37 and the substrate hole 13. Accordingly, the substrate 10, the window unit, and the base plate may be securely coupled to each other using one screw.

Meanwhile, in FIGS. 1 and 2, grooves having a substantially semicircular shape may be disposed around the holder 30 to couple other components to the holder 30. In some exemplary embodiments, the grooves may be omitted.

FIGS. 1 and 2 show only one window unit disposed on one substrate, however, the inventive concepts are not limited thereto. According to another exemplary embodiment, two or more window units may be disposed on one substrate. More particularly, the window unit according to the illustrated exemplary embodiment includes the windows that are arranged in two-by-two matrix in one holder, and is disposed on the substrate having the light emitting areas arranged in two-by-two matrix. However, according to another exemplary embodiment, two window units each including the windows arranged in two-by-two matrix in one holder may be disposed on the substrate having the light emitting areas arranged in two-by-four matrix. According to still another exemplary embodiment, the windows in the two or more window units may be arranged on one substrate with different matrices from each other. In some exemplary embodiments, modules having various sizes may be formed through these various arrangements.

The light emitting device module according to exemplary embodiments may be easily repaired as compared with a conventional light emitting device module. In the conventional light emitting device module, a holder and a window are typically formed integrally with each other even when the light emitting areas are provided in plural. As such, when a defect occurs in one window, the entire window unit may need to be replaced at the same time. In the light emitting device module according to exemplary embodiments, since the plural windows are individually coupled to the holder in detachable and attachable manner, only the window having a defect may be separated and replaced, and thus, the light emitting device module may be easily repaired.

In addition, according to exemplary embodiments, since the window is detachably coupled to the holder, the profile of light emitted from the light emitting device module may be set in various ways, and the profile of light may be easily changed by replacing a portion or all of the windows as needed. For example, considering directions of the light, the windows are disposed and coupled to the holder with substantially the same direction as each other in accordance with the light emitting area. However, in some exemplary embodiments, when the advance directions of light are directed to different directions from each other, the corresponding windows may be disposed and coupled in accordance with the light emitting area, and thus, light may be emitted in various directions as desired by a user. In an exemplary embodiment, the advance directions of light may be easily changed by using different light emitting devices or different lenses. In particular, light may easily travel in a desired direction by changing the shape or curvature of the lens according to the light emitting area.

Further, since the light emitting device module according to the exemplary embodiments includes the insertion protrusion and the insertion recess, the window may be coupled to the holder in a specific direction when being coupled to the holder. As such, the window may be prevented from being disposed in a wrong direction, for example, from being rotated about 90 or about 180 degrees and being misaligned with a specific direction.

Hereinafter, the window unit including the holder and the attachable and detachable window will be described in detail with reference to accompanying drawings.

Figure 3:
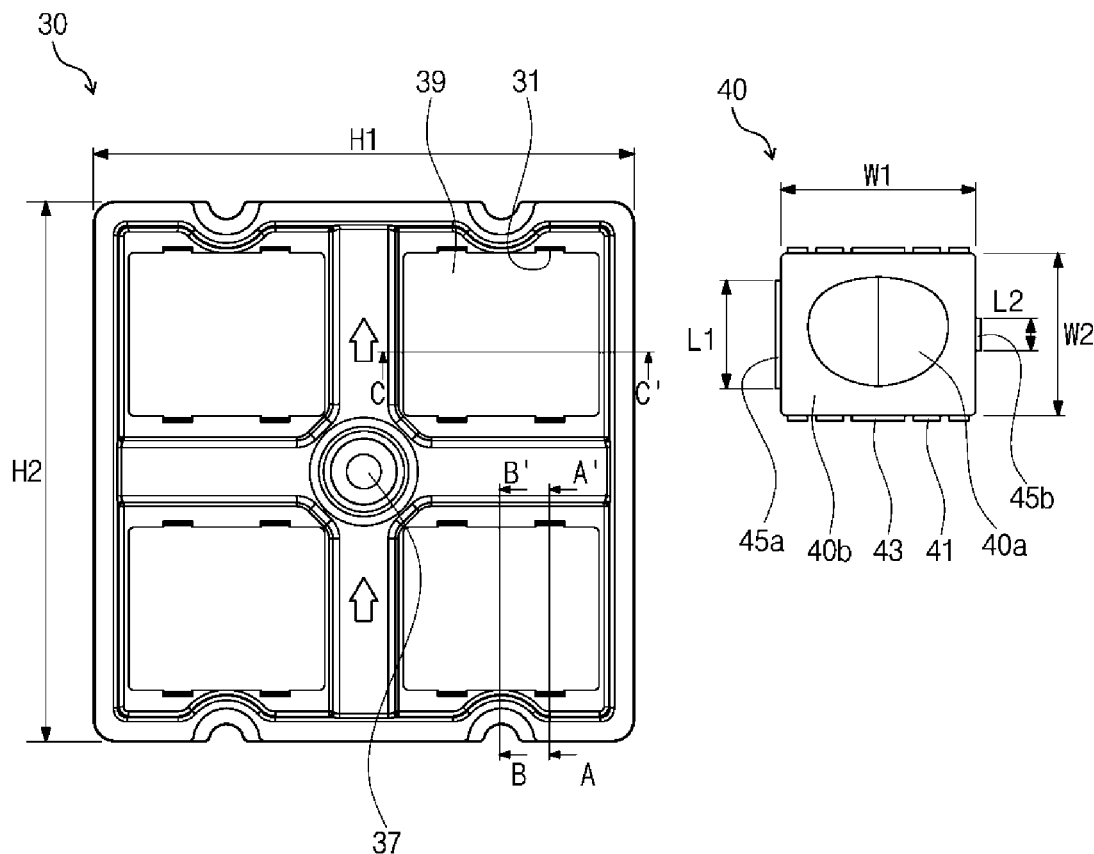
FIG. 3 is a plan view of a window unit including a holder provided with an opening defined therethrough and a window coupled to the opening of the holder according to an exemplary embodiment.
Figure 4A:
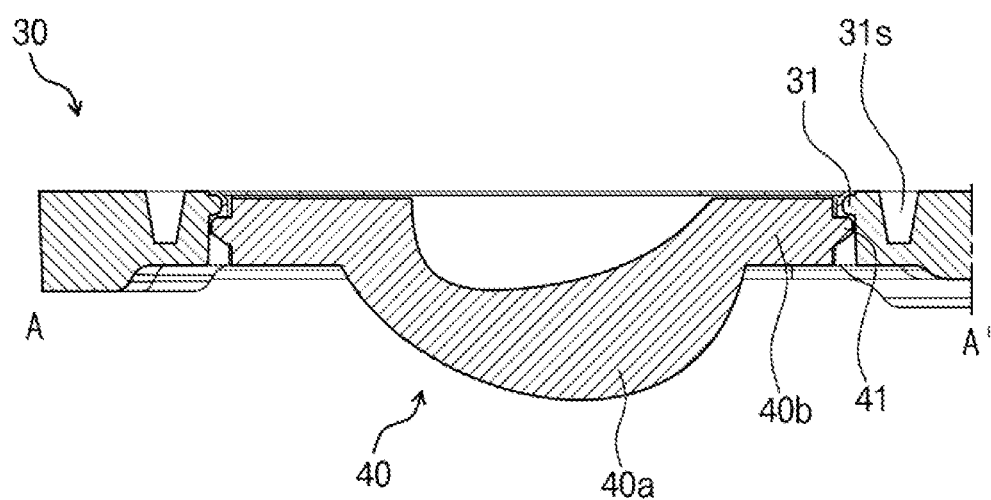
FIGS. 4A, 4B, and 4C are cross-sectional views taken along lines A-A', B-B', and C-C' of FIG. 3, respectively.
Figure 4B:
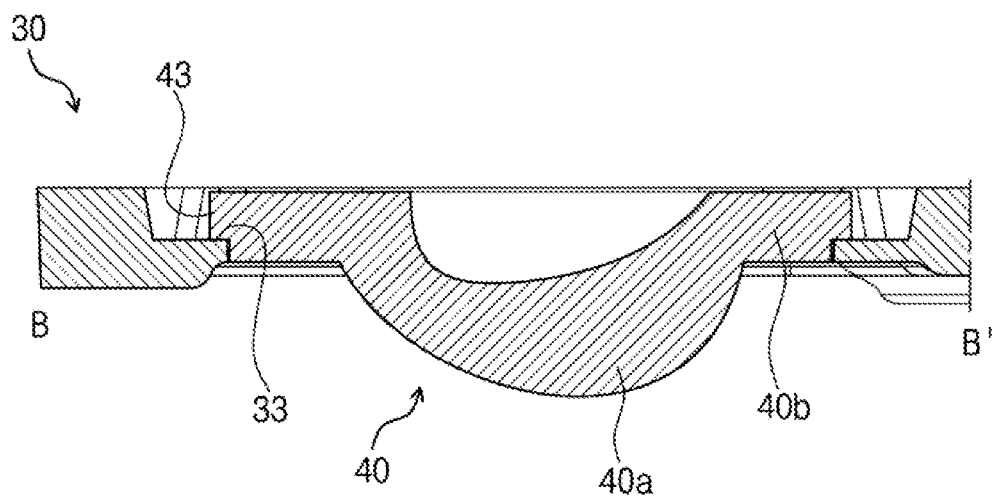
Figure 4C:
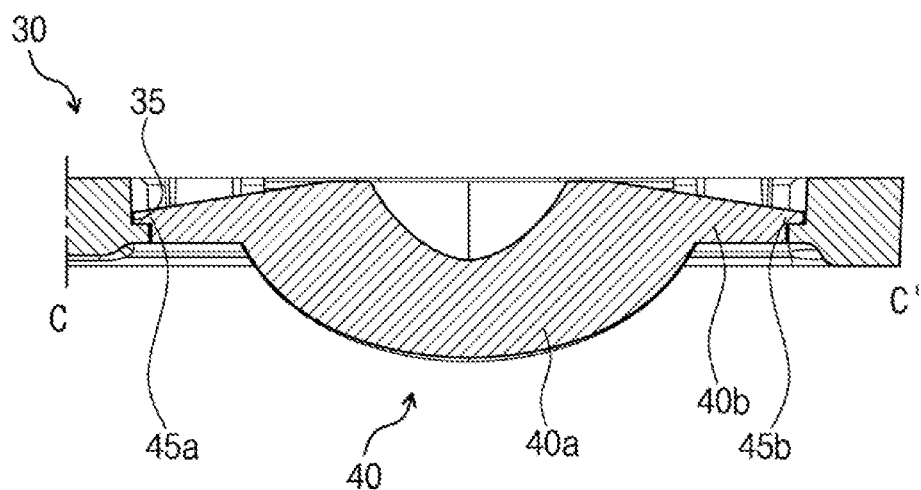

FIG. 3 is a plan view of the window unit according to an exemplary embodiment. FIG. 3 is a plan view showing the holder 30 provided with the opening 39 and one window 40 that is configured to be coupled to the opening 39 of the holder 30. FIGS. 4A, 4B, and 4C are cross-sectional views taken along lines A-A', B-B', and C-C' of FIG. 3, respectively.

FIG. 3 shows the holder 30 and the window 40 separately. However, FIGS. 4A, 4B, and 4C show the cross-sections of the window unit when the window 40 is coupled to the holder 30. In addition, the window unit shown in FIG. 1 is shown upside down in FIGS. 4A, 4B, and 4C to illustrate the coupling process of the window 40 and the holder 30.

Referring to FIG. 3, the holder 30 may have substantially the same shape as that of the substrate 10. For example, the holder 30 may have a substantially square shape as shown in FIG. 3. However, the inventive concepts are not limited to a particular shape of the holder 30.

As used herein, a horizontal direction is referred to as a "first direction" and a vertical direction is referred to as a "second direction", sides corresponding to the first and second directions of the holder 30 may refer to a width H1 and a length H2, respectively.

In an exemplary embodiment, each of four openings 39 may have a predetermined width and a predetermined length.

The window 40 has a width W1 and a length W2, which respectively correspond to the width and the length of the opening 39, such that the window 40 may be coupled to each opening 39 of the holder 30. For example, the width W1 and the length W2 of the window 40 are slightly less than the width and the length of the opening 39, respectively, and thus, the window 40 may be easily inserted into corresponding opening 39. When the window 40 is inserted into the opening 39, the window 40 may be securely coupled to the holder 30 by the coupling members provided in the window 40 and the holder 30.

In an exemplary embodiment, the width H1 and the length H2 of the holder 30 may be changed depending on the number and arrangements of the windows 40. Hereinafter, the holder 30 will be described as having a substantially square shape with four openings 39 as shown in FIG. 3.

The width H1 and the length H2 of the holder 30 may have a ratio of about 1:0.8 to about 1:1.25. In an exemplary embodiment, when the width H1 of the holder 30 is about 50 mm, the length H2 of the holder 30 may be within a range from about 45 mm to about 55 mm. As another example, when the length H2 of the holder 30 is about 50 mm, the width H1 of the holder 30 may be within a range from about 45 mm to about 55 mm. In an exemplary embodiment, the width H1 and the length H2 of the holder 30 may be changed in various ways, and thus, the width H1 of the holder 30 and the length H2 of the holder 30 may be changed appropriately within the range from about 45 mm to about 55 mm, and may be matched with each other in an appropriate combination. For example, the width H1 of the holder 30 may be about 50 mm, and the length H2 of the holder 30 may be about 50 mm.

The width W1 and the length W2 of the window 40 may be varied depending on the size of the holder 30, the number and arrangements of the windows 40, and the direction to which light emitted from the light emitting device 20 is directed. Hereinafter, the window 40 corresponding to the holder 30 will be described as having a substantially square shape that corresponds to one of the openings 39 as shown in FIG. 3.

The width W1 and the length W2 of the window 40 may have a ratio of about 1:0.5 to about 1:1.3. More particularly, when the width H1 and the length H2 of the holder 30 are determined, the width W1 and the length W2 of the window 40 may be provided within a predetermined range in consideration of the complexity of attachment and detachment structure and an irradiation angle of light emitted from the light emitting device.

In an exemplary embodiment, when the width W1 of the window 40 is about 19 mm, the length W2 of the window 40 may be within a range from about 15 mm to about 23 mm. As another exemplary, when the length W2 of the window 40 is about 16 mm, the width W1 of the window 40 may be within a range from about 12 mm to about 20 mm. In an exemplary embodiment, the width W1 and the length W2 of the window 40 may be changed in various ways, and thus, the width W1 of the window 40 may be changed appropriately within the range from about 15 mm to about 23 mm, the length W2 of the window 40 may be changed appropriately within the range from about 12 mm to about 20 mm, and the width W1 and the length W2 of the window 40 may be matched with each other in an appropriate combination. For example, the width W1 of the window 40 may be about 19 mm, and the length W2 of the window 40 may be about 16 mm.

When the width and the length of the holder 30 or the window 40 are within the above-mentioned range, a rigidity of the holder 30 or the window 40 may be maintained.

Referring to FIGS. 3, 4A, 4B, and 4C, the window 40 has a convex shape in one direction.

In an exemplary embodiment, the lens part 40a of the window 40 includes a first surface convexly protruded from a surface of the flat part 40b and a second surface opposite to the first surface. At least a portion of each of the first surface and the second surface may be a curved surface. For example, the entire lens part 40a may be formed of a curved surface as shown in the figures.

The shape of the lens part 40a may be selected in various ways by taking into account the purpose of usage of the light emitting device module, the type of the light emitting device 20 used, the profile of light from the light emitting device 20, and the profile of light exiting through the lens part 40a.

The shape of the lens part 40a of the window 40 may have an asymmetrical shape with respect to a line passing through a center of the window 40, e.g., the line B-B'. Particularly, the first and second surfaces of the lens part 40a may have different shapes from each other. For example, each of the first and second surfaces of the lens part 40a may be asymmetrical with respect to a line passing through a center of the lens part 40a, and the first and second surfaces of the lens part 40a may have different curvatures from each other.

The first and second surfaces of the lens part 40a may be used to control the advance direction of light emitted from the light emitting device 20, and may have various shapes. For example, although light emitted from the light emitting device 20 is isotropic, light passing through and exiting from the lens part 40a may have various profiles depending on the shape of the lens part 40a. When light emitted from the light emitting device 20 is anisotropic, light passing through and exiting from the lens part 40a may have an isotropic profile by changing the shape of the lens part 40a.

In addition, since the lens part 40a has the concave second surface, light emitted from the light emitting device 20 may effectively travel to the first surface. In particular, the light emitting device 20 is disposed in the concave portion of the lens part 40a. Accordingly, even though a large amount of light is emitted through the side of the light emitting device 20, light may travel as much as possible within the lens part 40a, and thus, a light extraction efficiency may be increased.

Referring to FIGS. 3 and 4A, the coupling protrusions are disposed in the window 40 and the holder 30 to couple the window 40 to the holder 30.

The window coupling protrusions 41 are disposed at both sides of the window 40 and protruded from the window 40 towards the holder 30. The holder coupling protrusions 31 facing each other are protruded from the holder 30 towards the window 40. The window coupling protrusion 41 and the holder coupling protrusion 31 are coupled to each other.

The holder 30 includes a slot 31s recessed from a surface of the holder 30 and defined adjacent to the holder coupling protrusion 31. The slot 31s may provide a space such for the holder coupling protrusion 31 to move during the coupling process.

Referring to FIGS. 3 and 4B, a plurality of members may be provided in the window 40 and the holder 30 to securely couple the window 40 and the holder 30. In particular, the supporting recess 33 is defined in the holder 30 as a stopper to prevent the window 40 from passing through the holder 30 when the window 40 is coupled to the holder 30 while moving in one direction. The window 40 is provided with the supporting protrusion 43 that prevents the window 40 from moving further by the supporting recess 33 when the window 40 moves a predetermined distance in one direction. The supporting protrusion 43 is protruded from the window 40 towards the holder 30, and the supporting recess 33 is formed in a shape to be engaged with the supporting protrusion 43 of the window 40.

Referring to FIGS. 3 and 4C, additional members are provided to the window 40 and the holder 30 to determine a coupling direction of the window 40 when the window 40 is coupled to the holder 30. More particularly, the insertion protrusion 45 is disposed on each window 40 to determine the coupling direction of the window 40 when the window 40 is coupled to the holder 30. The insertion protrusion 45 includes first and second insertion protrusions 45a and 45b respectively disposed at both sides of the window 40. The insertion recesses 35 corresponding to the first and second insertion protrusions 45a and 45b are defined in the holder 30. According to an exemplary embodiment, the first and second insertion protrusions 45a and 45b have different lengths from each other, and the insertion recesses 35 corresponding to the first and second insertion protrusions 45a and 45b have different lengths from each other. For example, as shown in FIG. 3, the first insertion protrusion 45a may have a first length L1, the second insertion protrusion 45b have a second length L2 less than the first length L1. One of the insertion recesses 35 corresponding to the first insertion protrusion 45a has a relatively longer length, and the other one of the insertion recesses 35 corresponding to the second insertion protrusion 45b has a relatively shorter length. In this manner, the first and second insertion protrusions 45a may prevent the window 40 from being coupled to the holder 30 at opposite direction, as the first and second insertion protrusions 45a and 45b are inserted into corresponding insertion recesses due to their corresponding lengths, respectively.

In an exemplary embodiment, light emitted from the light emitting device 20 has an anisotropy. In this case, the window 40 may need to be aligned in the opening 39 such that light is emitted in a predetermined direction. Directions of the first and second insertion protrusions 45a and 45b may function as aligning the window 40 so that light is emitted in the predetermined direction in accordance with the anisotropy of light. Accordingly, the window 40 may be coupled only in a predetermined direction without being rotated, and the window 40 may be accurately aligned in the opening 39.

In an exemplary embodiment, when the plural windows 40 are used, the first protrusions 45a of different windows 40 disposed in the light emitting areas may face the same direction, and the second protrusions 45b of different windows 40 disposed in the light emitting areas may also face the same direction. However, the inventive concepts are not limited thereto. In some exemplary embodiments, the first and second insertion protrusions 45a and 45b of the windows 40 may face different directions from each other, respectively.

In addition, according to an exemplary embodiment, light may travel isotropically by the light emitting device 20 and the window 40 rather than traveling anisotropically. In this case, since the window 40 according to an exemplary embodiment may be accurately aligned with the opening 39 by the first and second insertion protrusions 45a and 45b, the light emitting device module may have a reliable structure.

In an exemplary embodiment, the surfaces of the flat part 40b of the window 40 may or may not be flat. For example, the upper or lower surface of the flat part 40b according to an exemplary embodiment may be substantially parallel to the upper surface of the substrate 10, however as shown in figures, a portion of the upper or lower surface of the flat part 40b may be slanted with respect to the upper surface of the substrate 10 in some exemplary embodiments. In this manner, the window 40 may be easily coupled to the holder 30 without being limited thereto.

The window 40 of the window unit having the above-described structure may be easily replaced by being attached or detached to or from the holder 30 in one direction.

Figure 5:
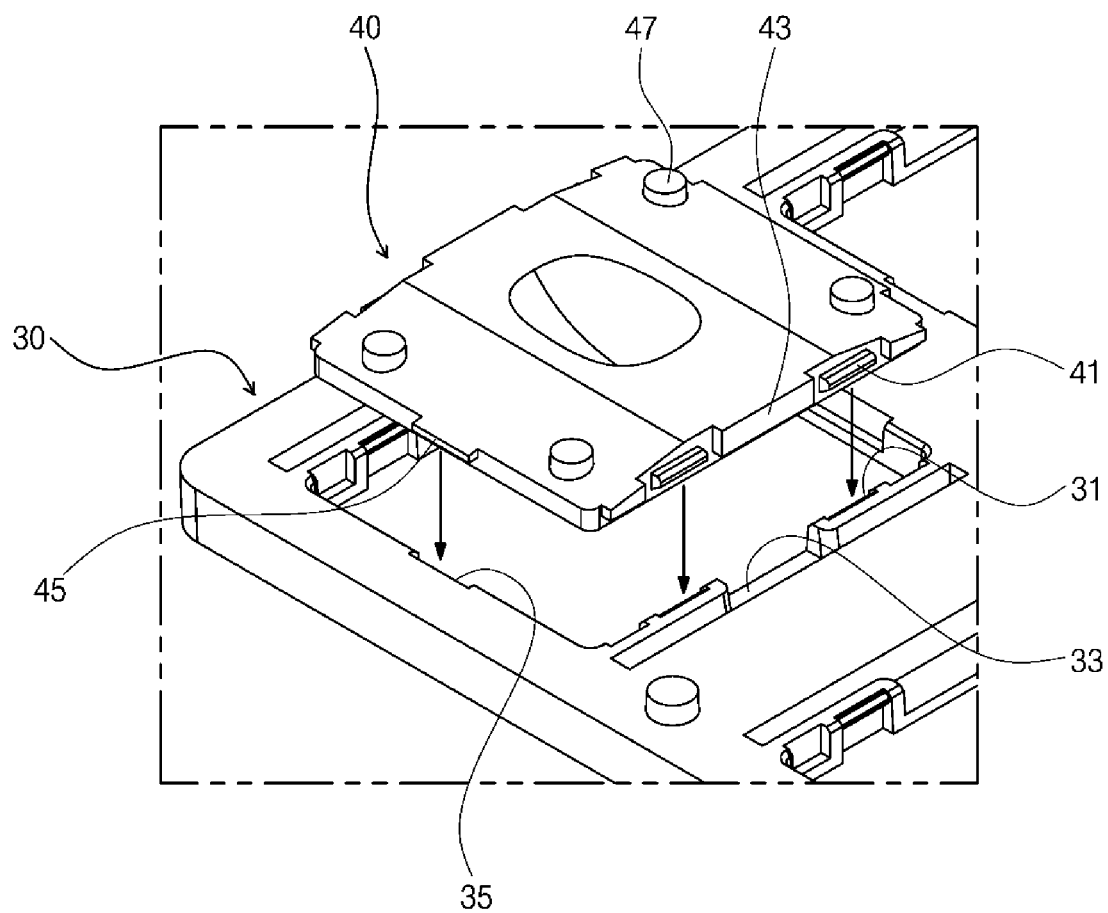
FIG. 5 is a perspective view illustrating a coupling process of the window to the holder in the window unit of the light emitting device module according to an exemplary embodiment.
Figure 6A:
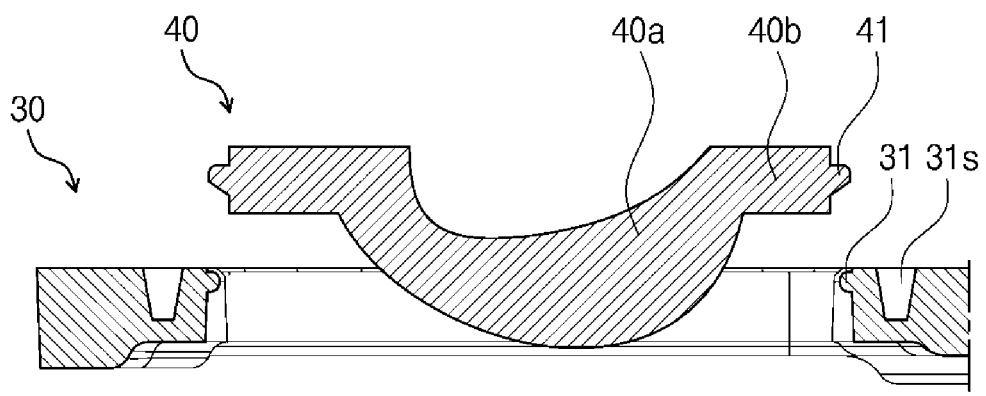
FIGS. 6A, 6B, and 6C are cross-sectional views sequentially showing processes for coupling the window to the holder according to an exemplary embodiment.
Figure 6B:
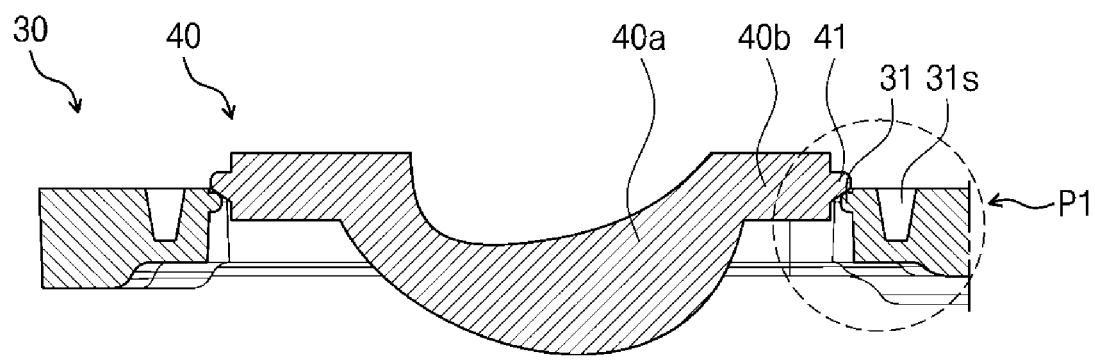
Figure 6C:
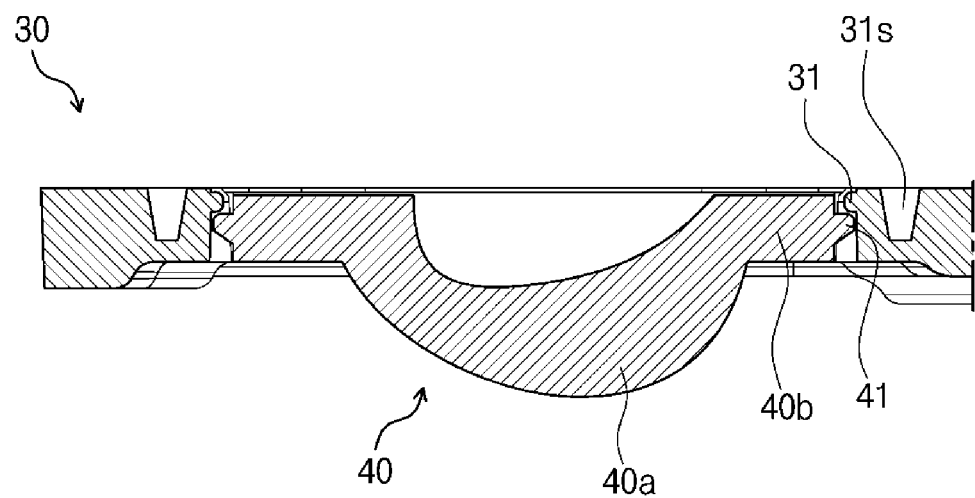
Figure 7:
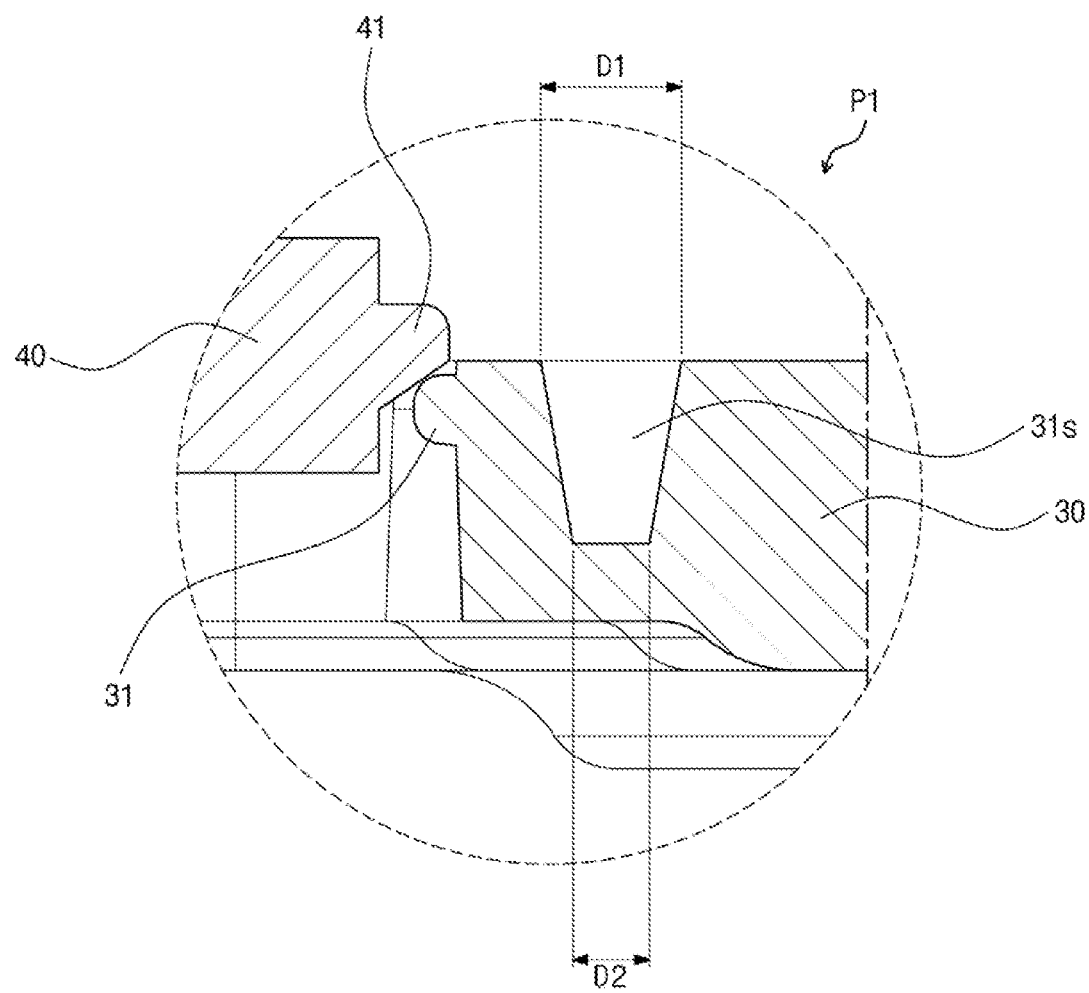
FIG. 7 is an enlarged view showing portion P1 of FIG. 6B.

FIG. 5 is a perspective view illustrating a coupling process of the window 40 to the holder 30 in the window unit of the light emitting device module according to an exemplary embodiment. FIGS. 6A, 6B, and 6C are cross-sectional views taken along line B-B' to sequentially show the processes for coupling the window 40 to the holder 30. FIG. 7 is an enlarged view of portion P1 of FIG. 6B.

As shown in FIGS. 5 and 6A, the window 40 may be inserted into and coupled to the holder 30 in a top-down manner, e.g., from top to bottom, or in a bottom-up manner, e.g., from bottom to top, depending on the direction of the coupling protrusions. In an exemplary embodiment, the window 40 may be coupled to the holder 30 by applying the force to the window 40 from top to bottom after the window is placed upside down such that the convex portion of the window 40 faces the bottom.

The slot 31s is defined between an outer side surface of the holder 30 and the holder coupling protrusion 31. The slot 31s provides a space to allow the holder coupling protrusion 31 protruded from the holder 30 to move outwardly.

Then, as shown in FIGS. 5 and 6B, the holder coupling protrusion 31 and the window coupling protrusion 41 make contact with each other. The holder coupling protrusion 31 and the window coupling protrusion 41 are disposed to overlap with each other when viewed in a plan view.

The holder coupling protrusion 31 and the window coupling protrusion 41 may have a curved shape in a cross-section. Accordingly, when the external force is applied to the bottom from the top, the holder coupling protrusion 31 slides backward. As such, as shown in FIG. 6C, the window coupling protrusion 41 passes through the holder coupling protrusion 31, and is disposed beneath the holder coupling protrusion 31. In an exemplary embodiment, since the slot 31*s* is defined in one side portion of the holder coupling protrusion 31, the holder coupling protrusion 31 may easily move towards an outward direction of the holder 30 and may be restored back to its original position due to an elastic force after the window coupling protrusion 41 passes through the holder coupling protrusion 31 and is disposed beneath the holder coupling protrusion 31.

As shown in FIG. 7, the slot 31*s* has a width D1 at its upper portion and a width D2 different from the width D1 at its lower portion. The width of the slot 31*s* becomes smaller as a distanced away from the upper surface of the holder 30. The difference in widths of the slot 31*s* may increase the rigidity of the holder coupling protrusion 31. When the width of the slot 31*s* is constant, the rigidity of the holder coupling protrusion 31 is weakened, and the restoration force of the holder coupling protrusion 31 may not be strong.

In an exemplary embodiment, the window 40 is coupled to the holder 30 by the above-mentioned manner, and when a force is applied to an opposite direction to the above-mentioned direction, the window 40 may be separated from the holder 30.

The light emitting device module according to an exemplary embodiment may be employed in various types of lighting devices. The light emitting device module may be, for example, an indoor light, such as an interior lamp, or an outdoor light, such as a street light.

Figure 8:
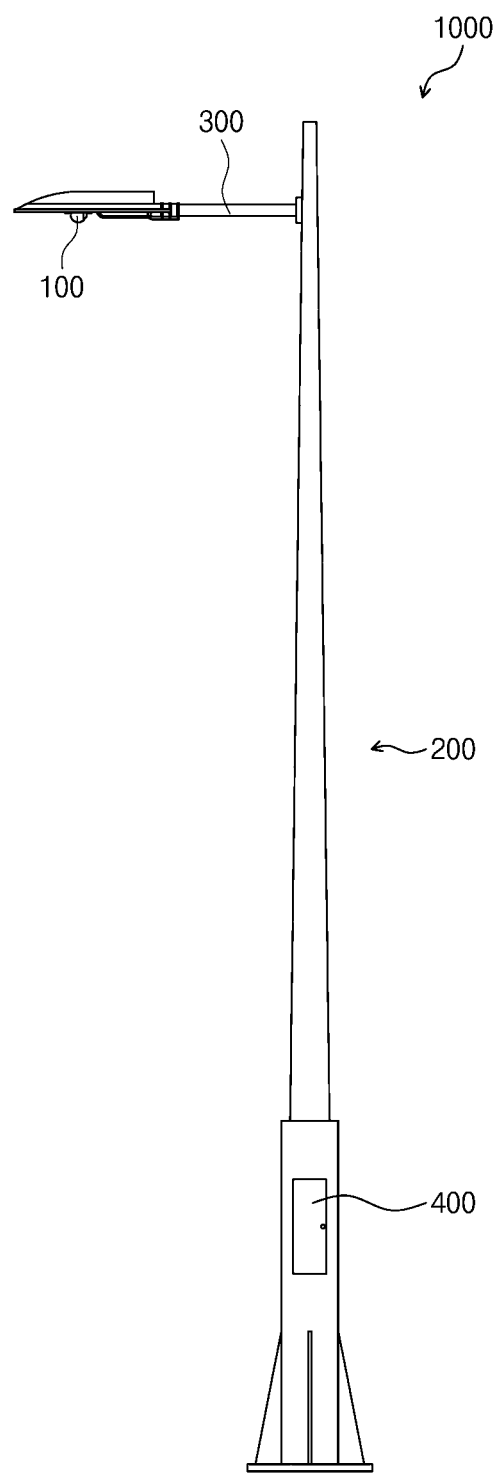
FIG. 8 is a side view showing a street light according to an exemplary embodiment.

FIG. 8 is a side view of the street light 1000 to which the light emitting device module is applied according to an exemplary embodiment.

Referring to FIG. 8, the street light 1000 includes a pole 200 extending in one direction, an arm 300 connected to one side portion of the pole 200, and the light emitting device module 100.

The pole 200 has a bar shape extending upward from a ground. The pole 200 may be installed at various angles with respect to the ground and generally provided to be substantially perpendicular to the ground.

The arm 300 is connected to an upper portion of the pole 200. The arm 300 has a bar shape extending in one direction. One end of the arm 300 is connected to the upper portion of the pole 200. The light emitting device module 100 is connected to the other end of the arm 300. The light emitting device module 100 may be provided with a cover that protects the light emitting device module 100 and allow light emitted from the light emitting device module 100 to travel in downward and/or lateral direction.

In the illustrated exemplary embodiment, the arm 300 extends from the pole 200 in one direction, however, the inventive concepts are not limited thereto. For example, the arm 300 may have various shapes or may be omitted in some exemplary embodiments. When the arm 300 is omitted, the light emitting device module 100 may be directly connected to the pole 200.

The light emitting device module 100 is connected to one end portion of the arm 300 to provide light to the downward and/or lateral direction. The direction in which light emitted from the light emitting device module 100 travels may be changed depending on a height of the street light 1000 and a position of the street light 1000.

In an exemplary embodiment, a supporter that stably supports the pole 200 and a controller 400 that controls the light emitting device module 100 may be disposed at a lower portion of the pole 200. The controller 400 is electrically connected to the light emitting device module 100 and controls ON/OFF of the light emitting device of the light emitting device module 100 automatically or in response to a user's instructions.

Although a street light is illustrated as one of the application of the light emitting device module according to an exemplary embodiment, however, the inventive concepts are not limited to a particular application of the light emitting device module. The light emitting device module may be applied to various technical and industrial devices.

According to the exemplary embodiments, the light emitting device module may be easily attached and detached.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device module comprising:
a substrate comprising a plurality of light emitting areas;
light emitting devices disposed in each light emitting area and to emit light;
windows disposed on the substrate, each of the windows covering one of the light emitting areas and having an asymmetrical shape with respect to one direction; and
a holder for coupling the windows, the holder including a plurality of openings each having an asymmetrical shape,
wherein each of the windows is individually disposed in a corresponding one of the openings to be detachably coupled to the holder, and
wherein each window includes a first insertion protrusion and a second insertion protrusion having different lengths from each other and disposed at opposite sides of the window to guide a coupling direction between the window and the holder, and the first insertion protrusion and the second insertion protrusion are asymmetrical with each other.

2. The light emitting device module of claim 1, wherein:
the holder comprises a plurality of insertion members to guide a coupling direction between the window and the holder; and
the insertion members of the holder are asymmetrical with each other.

3. The light emitting device module of claim 2, wherein:
each window further comprises an insertion protrusion protruded toward the holder; and
the holder further comprises an insertion recess into which the insertion protrusion is inserted.

4. The light emitting device module of claim 1, wherein:
light emitted from the light emitting device has an anisotropy; and
the first and second insertion protrusions protrude in directions corresponding to the anisotropy of light.

5. The light emitting device module of claim 1, wherein the protruding directions of the first and second insertion protrusions are the same as each other.

6. The light emitting device module of claim 1, wherein:
the holder comprises holder coupling protrusions protruding toward each window;
each window comprises a window coupling protrusion protruding toward the holder; and
the holder coupling protrusion and the window coupling protrusion are engaged with each other.

7. The light emitting device module of claim 6, wherein the holder further comprises a slot recessed from a surface of the holder and disposed adjacent to the holder coupling protrusion.

8. The light emitting device module of claim 7, wherein the slot has a width that gradually decreases from the surface of the holder.

9. The light emitting device module of claim 1, wherein:
each window further comprises a supporting protrusion protruding toward the holder; and
the holder comprises a supporting recess corresponding to the supporting protrusion to stop the movement of the window in a predetermined direction beyond a predetermined distance.

10. The light emitting device module of claim 1, wherein each window comprises:
a lens part disposed to correspond to the light emitting area and having a curved surface; and
a flat part disposed around the lens part and being substantially parallel to a surface of the substrate.

11. The light emitting device module of claim 10, wherein the lens parts of the windows have the same shape as each other.

12. The light emitting device module of claim 10, wherein the lens parts of the windows have different shapes from each other.

13. The light emitting device module of claim 12, wherein each window is configured to change a direction of light emitted from the light emitting.

14. The light emitting device module of claim 1, wherein a ratio of a width to a length of the holder is about 1:0.8 to about 1:1.25, and a ratio of a width to a length of the window is about 1:0.5 to about 1:1.3.

15. A window unit for a light emitting device module, comprising:
one or more windows respectively covering light emitting areas and having an asymmetrical shape with respect to one direction, the window including a lens part having a curved surface and a flat part around the lens part; and
a holder for coupling the windows, the holder including a plurality of openings each exposing the entire lens part of the corresponding window and having an asymmetrical shape,
wherein:
each of the windows is individually provided in a corresponding one of the openings and is detachably coupled to the holder; and
the opening of the holder substantially exposes the entire flat part of the corresponding window.

16. The window unit of claim 15, wherein the lens part of the window and the corresponding opening of the holder have different shapes from each other in a plan view.

17. A light emitting device module comprising:
a substrate comprising a plurality of light emitting areas;
light emitting devices disposed in each light emitting area to emit light in an upward direction;
windows disposed on the substrate to cover each light emitting area; and
a holder to couple the windows, the holder including openings that correspond to each of the light emitting areas,
wherein:
each of the windows is detachably coupled to the holder and individually provided in a corresponding opening among the openings along a direction to anisotropically control an advance direction of light;
the holder includes a holder coupling protrusion protruding towards the window and a slot recessed from a surface of the holder; and
each window includes window coupling protrusion protruding toward the holder to be engaged with the holder coupling protrusion.

18. A street light comprising:
a pole extending in one direction;
an arm connected to one side portion of the pole; and
a light emitting device module disposed at one end portion of the arm, the light emitting device module comprising:
a substrate comprising a plurality of light emitting areas;
light emitting devices disposed in each light emitting area to emit light;
windows disposed on the substrate, each of the windows covering each light emitting area and having an asymmetrical shape with respect to one direction; and
a holder to couple the windows, the holder including a plurality of openings each having an asymmetrical shape,
wherein each of the windows is individually disposed in a corresponding one of the openings and is detachably coupled to the holder, and each window includes a plurality of insertion members to guide a coupling direction between the window and the holder, and
wherein the insertion members disposed at opposing sides of the window are asymmetrical with each other.

* * * * *